(12) United States Patent
Sayuk et al.

(10) Patent No.: US 8,476,922 B2
(45) Date of Patent: Jul. 2, 2013

(54) BALANCED IMPEDANCE METHOD FOR DIFFERENTIAL SIGNALING

(75) Inventors: Mark Sayuk, Reading, MA (US); Ronald Kapusta, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 131 days.

(21) Appl. No.: 13/117,805

(22) Filed: May 27, 2011

(65) Prior Publication Data

US 2012/0299618 A1 Nov. 29, 2012

(51) Int. Cl.
*H03K 17/16* (2006.01)

(52) U.S. Cl.
USPC .......................................................... 326/30

(58) Field of Classification Search
None
See application file for complete search history.

(56) References Cited

U.S. PATENT DOCUMENTS

| | | | |
|---|---|---|---|
| 5,424,662 A * | 6/1995 | Bonaccio | 327/55 |
| 2002/0084870 A1 | 7/2002 | Cranford | |
| 2005/0030108 A1 | 2/2005 | Duncan et al. | |
| 2007/0139112 A1 | 6/2007 | Bocock et al. | |
| 2008/0024176 A1 | 1/2008 | Wang et al. | |

OTHER PUBLICATIONS

"IEEE Standard for Low-Voltage Differential Signals (LVDS) for Scalable Coherent Interface (SCI)," IEEE Std. 1596. Mar. 1996, 34 pages.
"Electrical Characteristics of Low Voltage Differential Signaling (LVDS) Interface Circuits," TIA/EIA Standard TIA/EIA-644-A, Feb. 2001, 35 pages.
Boni et al., "LVDS I/O Interface for Gb/s-per-Pin Operation in 0.35-μm CMOS," IEEE J. Solid-State Circuits, vol. 36, No. 4, Apr. 2001, pp. 706-711.
Chen et al., "Low-Voltage Low-Power LVDS Drivers," IEEE J. Solid-State Circuits, vol. 40, No. 2, Feb. 2005, pp. 472-479.
Tyhach et al., "A 90-nm FPGA I/O Buffer Design With 1.6-Gb/s Data Rate for Source-Synchronous System and 300-MHz Clock Rate for External Memory Interface," IEEE J. Solid-State Circuits, vol. 40, No. 9, Sep. 2005, pp. 1829-1838.
Song et al., "A Reduced-Swing Voltage-Mode Driver for Low-Power Multi-Gb/s Transmitters," Journal of Semiconductor Technology and Science, vol. 9, No. 2, Jun. 2009, pp. 104-109.

* cited by examiner

*Primary Examiner* — Crystal L Hammond
(74) *Attorney, Agent, or Firm* — Kenyon & Kenyon LLP

(57) ABSTRACT

A system and method for implementing a differential signaling driver with a common-mode voltage not equal to one half the power supply voltage using voltage-mode techniques. Embodiments of the present invention maintain balanced impedance at the signal output. In an embodiment, a driver may have multiple operating modes for each potential supply voltage or common-mode voltage. In an embodiment, each potential mode may involve configuring the driver by activating or deactivating switches or resistors in the driver and each potential mode may have different resistor values.

19 Claims, 10 Drawing Sheets

BALANCED IMPEDANCE METHOD FOR DIFFERENTIAL SIGNALING

BACKGROUND

Aspects of the present invention relate generally to the field of data transmission and more specifically to differential signaling at the physical layer.

Conventionally, differential signaling provides for transmission of a single instance of information content from a driver to a receiver via a pair of transmitted signals having opposite state (e.g., data+ and data−). Differential signaling may be used in analog or digital systems and provides an efficient method of communication with low power dissipation and low susceptibility to electromagnetic interference. Differential signaling may be implemented at the physical layer using any of several standards including, for example, RS-422, USB, Serial ATA (SATA), FireWire, or HDMI.

Each of the various methods of implementing differential signaling may have different data transmission rates and output voltage specifications. For example, Low Voltage Differential Signaling (LVDS) provides a low power, high-speed transmission of data in the physical layer and is sometimes used in analog-to-digital converters and digital signal processors requiring high-speed data transmissions. A subLVDS driver is similar to LVDS, but with a smaller differential swing and a smaller common-mode voltage than a standard LVDS driver and is sometimes used in camera analog front-ends and image processors. For example, an LVDS driver may have a data rate up to 1.9 Gbps, a differential output swing of 350 mV and a common-mode voltage of 1.25V, whereas a subLVDS driver may have a data rate of 416 Mbps with a differential voltage swing of 150 mV and a fixed common-mode voltage of 0.9V.

In conventional LVDS and subLVDS drivers, the supply voltage is typically 2× the common-mode voltage. Thus, a conventional LVDS driver may have a fixed common-mode voltage of 1.25V with a supply voltage of 2.5V, and a subLVDS driver may have a common-mode voltage of 0.9V with a supply voltage of 1.8V. Because the ideal power supply for the system is not necessarily 2× the common-mode, a separate supply is often dedicated to the driver. As multiple supplies generally imply extra cost, board area, and additional circuit complexity, this can be undesirable. If current-mode techniques are used, using 2× the common-mode is more a convention than a requirement. However, since the trend is for lower system supply voltages, current-mode techniques can have significant headroom limitations. Voltage-mode techniques are well suited to low supply voltages, but conventional methods require a supply of 2× the common-mode voltage in order to have a balanced output impedance. Therefore while it is desirable to limit the number of supplies, it is often impractical using conventional methods.

FIG. 1 is a simplified circuit diagram illustrating components of a conventional current-mode driver 100 that may be used for differential signaling. In the example of FIG. 1, a current is driven through the circuit to implement a current-mode driver 100. As shown in FIG. 1, the current-mode driver 100 may include a pair of circuit paths each extending from a current source 105 to a current sink 106 and including respective output terminals 104a, 104b. Each circuit path may include a switch 101a, 101b extending between the respective output terminal 104a, 104b and the current source 105 and a switch 102a, 102b extending between the respective output terminal 104a, 104b and the current sink 106.

As shown in FIG. 1, the current-mode driver 100 may receive a pair of differential input signals D+ and D− and may output a pair of differential output signals OUT+ and OUT− in response. An input signal (say, D+) may be input to the switches 101a, 102a of a first path. Similarly, the other input signal D− may be input to the switches 101b, 102b of a second path. Thus, when a differential input signal is asserted to the current-mode driver 100, one of the input signals D+, D− will cause its associated switches to conduct a current through the termination resistor 107 to produce a fixed differential output voltage given by |v(OUT+)−v(OUT−)|. The common-mode voltage is given by (v(OUT+)+v(OUT−))/2, and may be set by a servo loop (not shown) or other method. Termination resistor 107 may be implemented separately from the current-mode driver 100, and a known or expected termination resistance may impact the design of the current-mode driver 100.

Conventional current-mode drivers, as the driver depicted in FIG. 1, may additionally require bias currents, bias current generators, and/or servo loops to operate properly. Additionally, with lower supply voltages, current-mode drivers may require larger output devices that can lead to increased supply/substrate noise due to their larger capacitance.

FIG. 2 is a simplified circuit diagram illustrating components of a conventional voltage-mode driver 200 that may be used for differential signaling. In the example of FIG. 2, rather than switching a current through the driver, the supply voltages $V_{DD}$, $V_{SS}$ are switched to implement a voltage-mode driver 200. As shown in FIG. 2, the voltage-mode driver 200 may include a pair of circuit paths each extending between a pair of supply voltages ($V_{DD}$, $V_{SS}$) and including respective output terminals 204a, 204b. Each circuit path may include a switch 202a, 202b extending between the respective output terminal 204a, 204b and a first supply voltage $V_{DD}$ and a switch 203a, 203b extending between the respective output terminal 204a, 204b and the second supply voltage $V_{SS}$. The voltage-mode driver 200 further may include resistors 201a, 201b coupled between each output terminal 204a, 204b and one of the supply voltages.

As shown in FIG. 2, the voltage-mode driver 200 may receive a pair of differential input signals D+ and D− and may output a pair of differential output signals OUT+ and OUT− in response. An input signal (say, D+) may be input to the switches 202b, 203b of a first path. Similarly, the other input signal D− may be input to the switches 202a, 203a of a second path. Thus, when an input signal is asserted to the voltage-mode driver 200, one of the input signals D+, D− will cause its associated switches to conduct, which produces signal voltages on the output terminals 204a, 204b. Termination resistor 207 may be implemented separately from the driver.

However, conventional voltage-mode drivers, as the driver depicted in FIG. 2, are generally designed for a balanced output impedance which means that resistor 201a equals resistor 201b. Otherwise, the two output states would have different common-mode voltages, which may result in electromagnetic interference (EMI). Additionally, an unbalanced impedance may cause common-mode to differential conversion in the presence of unwanted common-mode signals. If resistors 201a and 201b are equal, it forces the common-mode voltage to equal one-half the supply voltage. This implies (for example) a 2.5V power supply for LVDS, and a 1.8V power supply for subLVDS. Accordingly, it may be desirable to implement a high-speed, differential signaling driver in voltage-mode with a single supply voltage not equal to 2× the common-mode voltage.

BRIEF DESCRIPTION OF THE DRAWINGS

The foregoing and other aspects of various embodiments of the present invention will be apparent through examination of the following detailed description in conjunction with the accompanying figures. Similar reference numbers are used to indicate functionally similar elements.

DETAILED DESCRIPTION

A voltage-mode differential signaling driver that maintains a balanced impedance at the signal output with a common-mode voltage not equal to one half the power supply voltage is implemented. This limits the traditional weaknesses of a differential signaling driver implemented with voltage-mode techniques. The outputs of the voltage-mode differential signaling driver may additionally operate at low supply voltages, and provide a simple driver design. Using voltage-mode rather than the conventional current-mode techniques provides for reduced complexity, smaller space requirements, less noise, the minimization of ESD spacing requirements, and lower headroom requirements.

Voltage-mode drivers may eliminate the conventional bias currents, bias current generators, servo loops, or other traditional components implemented to maintain proper common-mode in conventional current-mode drivers. Additionally, specialized high-voltage transistors and level shifters may be eliminated if different power supplies for the drivers and core circuitry are not required. Voltage-mode implementations may also allow for the elimination of large output devices, large pre-drivers, and support circuitry conventionally required for current-mode techniques that may lead to supply and substrate noise in some sensitive circuits. Additionally, series resistors present in many voltage-mode implementations can shunt ESD currents and eliminate large output transistors resulting from ESD spacing rules.

Figure 1:
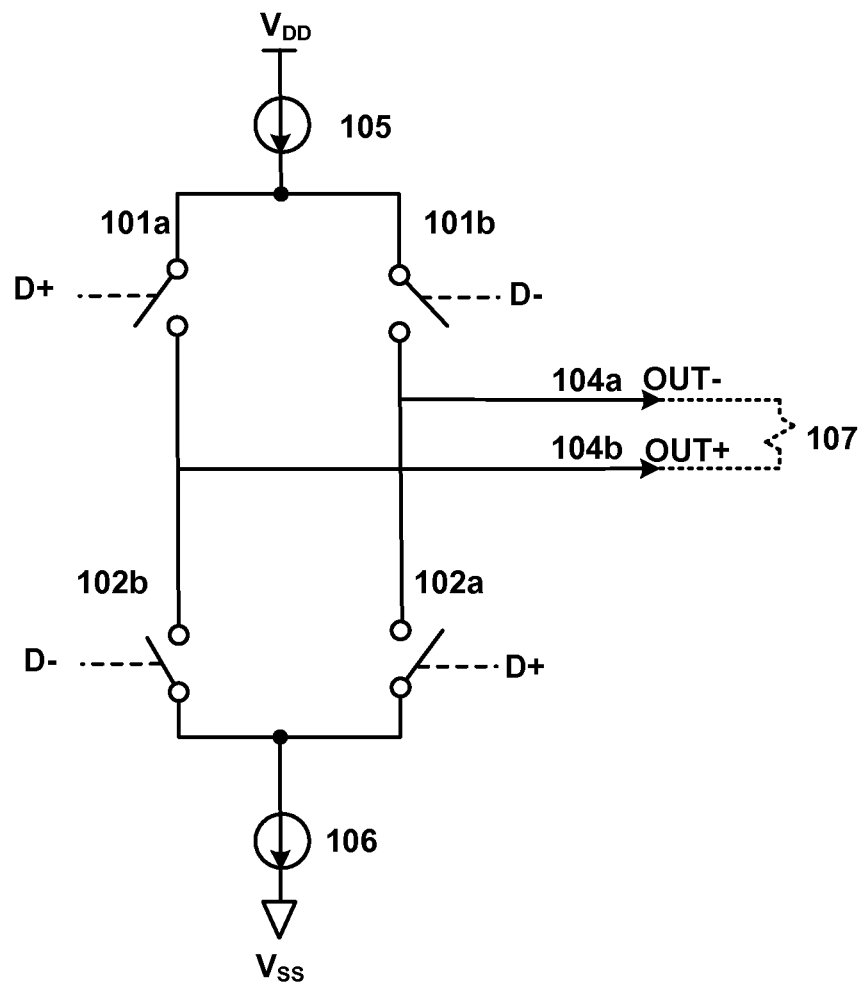
FIG. 1 is a simplified circuit diagram illustrating components of a conventional current-mode driver.
Figure 2:
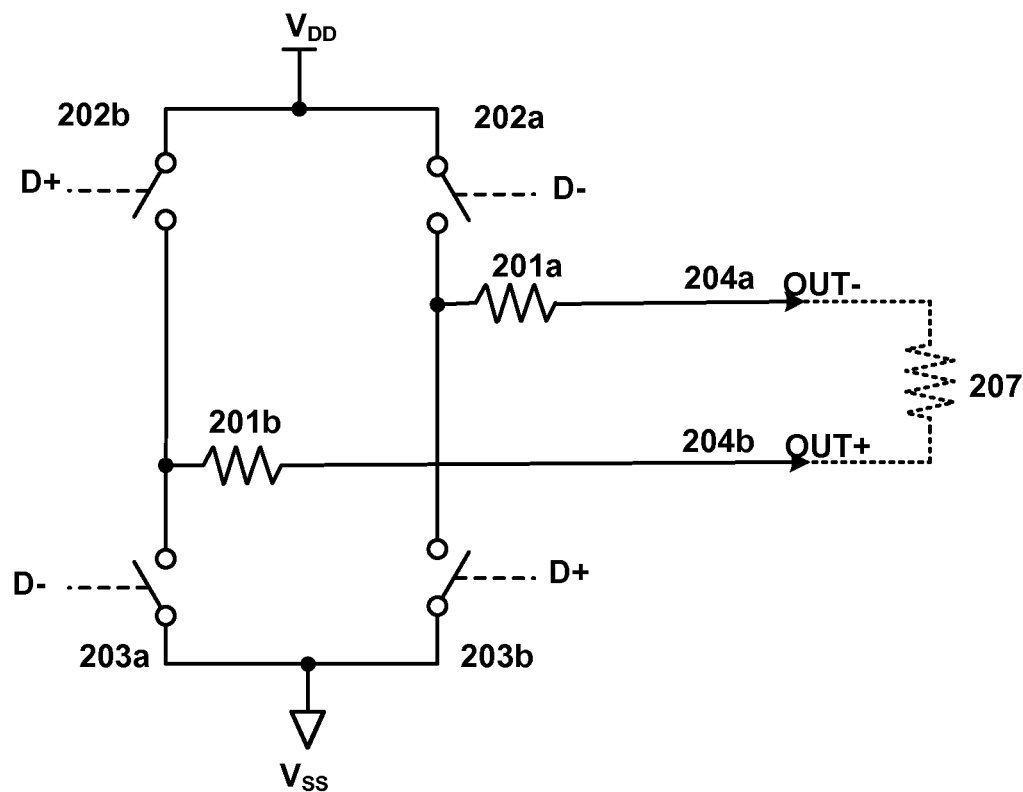
FIG. 2 is a simplified circuit diagram illustrating components of a conventional voltage-mode driver.
Figure 3:
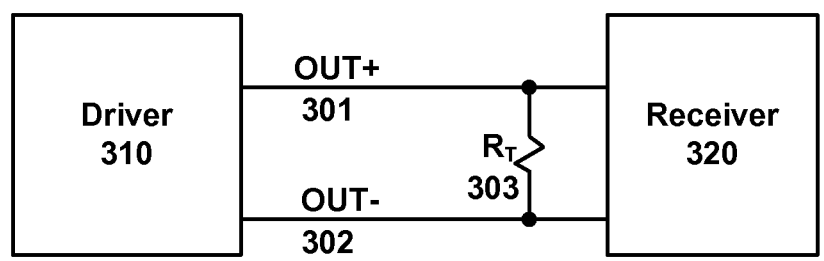
FIG. 3 is a simplified block diagram illustrating components of an exemplary differential signaling system according to an embodiment of the present invention.

FIG. 3 is a simplified block diagram illustrating components of an exemplary differential signaling system 300 according to an embodiment of the present invention. As shown in FIG. 3, a differential signaling system 300 may include a driver 310, a receiver 320, and a pair of wires or other transmission lines 301 and 302 to transmit a pair of signals from the driver 310 to the receiver 320. A termination resistor, $R_T$ 303, may be implemented to develop a signal at the receiver 320. Termination resistor $R_T$ 303 may be implemented separately from the driver, at the receiver 320 for example. The driver 310 may then direct a current through the termination resistor 303, producing an output voltage $V_{OD}$ of either + or −, representing a logic 1 or a logic 0. The receiver 320 may then interpret the signals as binary information.

Figure 4:
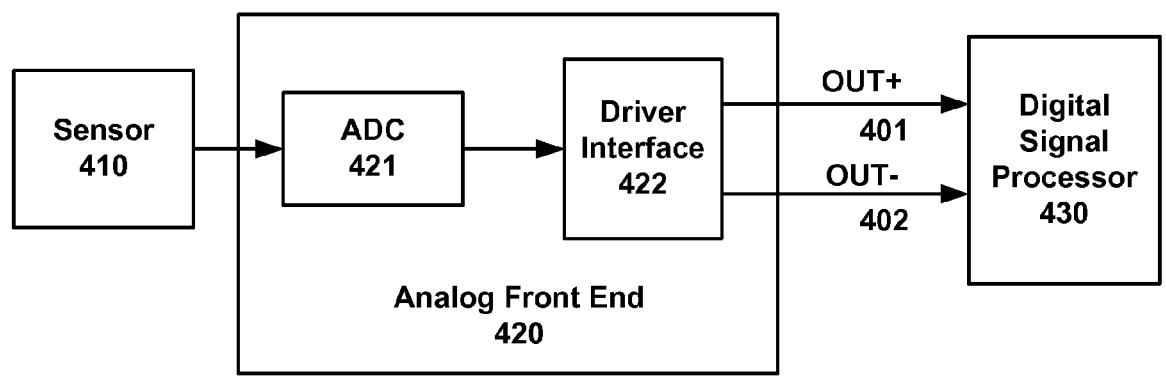
FIG. 4 is a simplified block diagram illustrating components of an exemplary system implementing a differential signaling driver according to an embodiment of the present invention.

FIG. 4 is a simplified block diagram illustrating components of an exemplary system 400 implementing a differential signaling driver according to an embodiment of the present invention. As shown in FIG. 4, an exemplary system 400 may include a sensor 410, an analog front-end circuit 420, and a digital signal processor (DSP) 430. The sensor 410 may be an analog sensor, including, for example, a charge-coupled device (CCD) or complementary metal-oxide semiconductor (CMOS) image sensor. The analog front-end 420 may include an analog-to-digital converter (ADC) 421 and a differential signaling interface 422. The differential signaling interface 422 may be a differential signaling driver to transmit the digitally converted signal to the DSP 430. The differential signaling interface outputs (OUT+ 401 and OUT− 402) may be transmitted on a pair of transmission lines to the DSP 430. Additionally, the analog front-end 420 may include a clock or other timing device, registers, additional analog-to-digital and digital-to-analog converters, and other components (not shown) to facilitate the front-end processing of the analog signal received from the sensor 410. The DSP 430 may be a digital image processor chip that performs digital processing and compression or other signal processor that performs other conventional digital signal processing techniques, including for example filtering and error correction.

Figure 5:
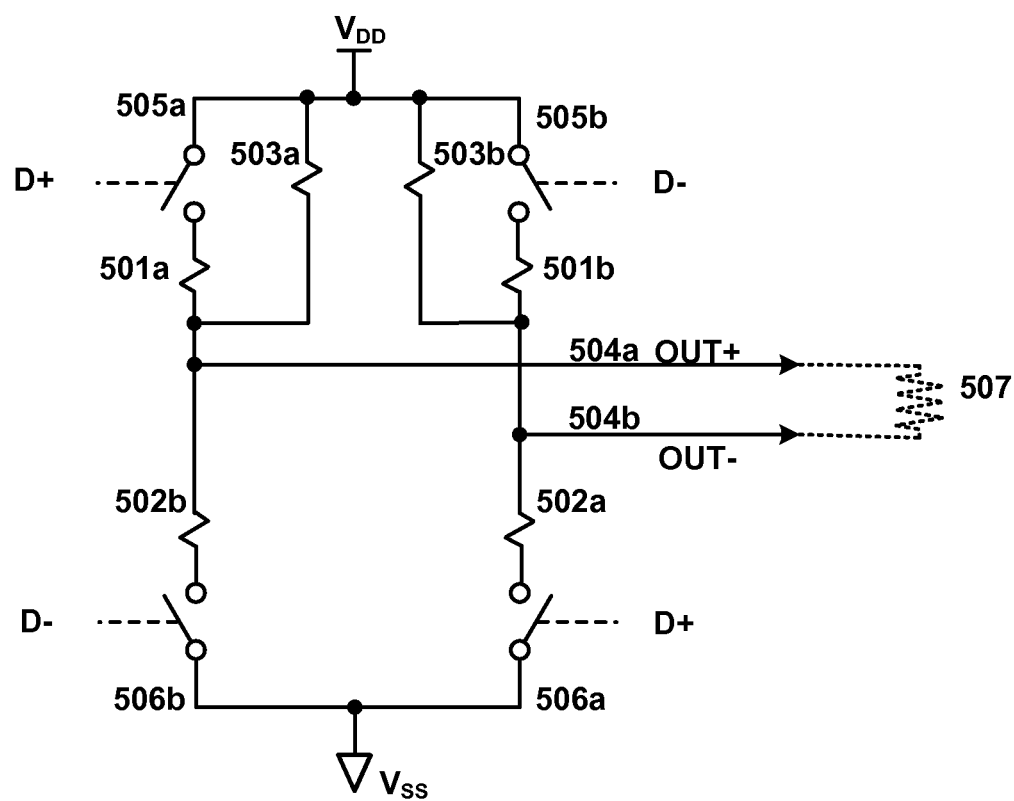
FIG. 5 is a simplified circuit diagram illustrating components of an exemplary differential voltage-mode driver according to an embodiment of the present invention.

FIG. 5 is a simplified circuit diagram illustrating components of an exemplary differential voltage-mode driver 500 according to an embodiment of the present invention. As shown in FIG. 5, the driver 500 may include a pair of circuit paths each extending between a pair of supply voltages ($V_{DD}$, $V_{SS}$) and including respective output terminals 504a, 504b. Each circuit path may include a switch 505a, 505b and a resistor 501a, 501b extending between the respective output terminal 504a, 504b and a first supply voltage $V_{DD}$ and a switch 506a, 506b and resistor 502a, 502b extending between the respective output terminal 504a, 504b and the second supply voltage $V_{SS}$. As will be apparent to those skilled in the art, the driver 500 may be implemented with additional supply voltages (not shown). The driver 500 further may include a third resistor 503a, 503b coupled between each output terminal 504a, 504b and one of the supply voltages.

As shown in FIG. 5, the driver 500 may receive a pair of differential input signals D+ and D− and may output a pair of differential output signals OUT+ and OUT− in response. An input signal (say, D+) may be input to the switches 505a, 506a of a first path. Similarly, the other input signal D− may be input to the switches 505b, 506b of a second path. Thus, when a differential input signal is asserted to the driver 500, one of the input signals D+, D− will cause its associated switches to conduct, which produce signal voltages on the output terminals 504a, 504b. Resistors 503a, 503b are always conductive in this embodiment.

As shown in FIG. 5, an exemplary differential voltage-mode driver 500 is configured with a balanced output impedance and a common-mode voltage ($V_{CM}$) such that the supply voltage $V_{DD} \neq 2 \times V_{CM}$. The driver 500 is implemented using voltage-mode techniques rather than the conventional current-mode techniques, such that instead of switching the signal current, the voltages $V_{DD}$ and $V_{SS}$ are switched and a resistor divider may develop a signal across the termination resistor 507. Termination resistor 507 may be implemented separately from the driver, and a known or expected termination resistance may impact the design of the driver or the selection of the remaining resistor values.

The driver's differential voltage swing $V_{OD}$ and common mode voltage $V_{CM}$ depend on the values of the resistors within the driver 500. In the embodiment of FIG. 5, where resistors 501a and 501b are equal to resistors 502a and 502b, the differential voltage swing $V_{OD}$ and common mode voltage $V_{CM}$ may be given as provided below in Equations 1 and 2:

$$V_{OD} = \frac{V_{DD} * R_{507}}{2R_{501} + R_{507}\left(1 + \frac{R_{501}}{R_{503}}\right)} \quad \text{Eq. 1}$$

$$V_{CM} = V_{DD}\left[1 - \frac{R_{503}}{2(R_{501} + R_{503})}\right] \quad \text{Eq. 2}$$

In the embodiment of FIG. 5, a balanced impedance at the outputs may be attained when resistors 501a and 501b are equal to resistors 502a and 502b. Consider an example where the D+ input is a high voltage level, which renders switches 505a and 506a conductive and, therefore the D− input causes switches 505b and 506b to be non-conductive. In this example, if R501a, R501b, R502a, R502b, R503a, and R503b are all equal, the resistance from output terminal 504a to $V_{DD}$ is half the resistance of resistor 503a because resistors 501a and 503a are in parallel. The resistance from output terminal 504b to the voltage supplies also is half the resistance of resistor 503b because resistors 502a and 503b are effectively in parallel for output impedance purposes. Thus, the output impedances are balanced.

The driver 500 finds application in a variety of design environments. For example, in a subLVDS application, it is desired to provide differential signaling in which $V_{OD}$ is 150 mV and $V_{CM}$ is 0.9V. In an exemplary embodiment where resistors 501a, 501b, 502a, 502b, 503a and 503b each are set to 300Ω and termination resistor 507 is set to 100Ω, the driver meets this objective with $V_{DD}$=1.2V.

As noted, the resistance values present in the circuit may determine the differential voltage swing $V_{OD}$ and common-mode voltage $V_{CM}$ that will arise in operation. In some implementations, the resistance values may remain static once the driver 500 is fabricated in an integrated circuit. Circuit designers may select different resistance values to accommodate their own design goals. In other embodiments, as discussed below, the resistance values may vary dynamically during circuit operation. These embodiments permit circuit designers to provide differential voltage swings $V_{OD}$ and common mode voltages $V_{CM}$ that vary dynamically in response to different operating conditions of the driver.

Figure 6:
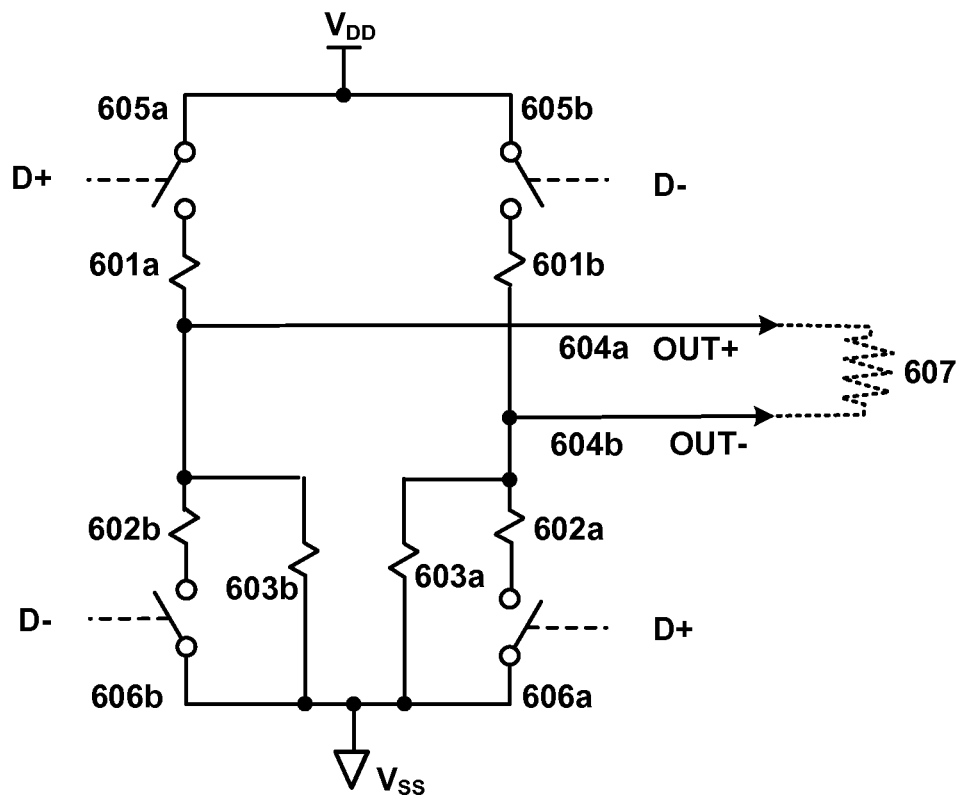
FIG. 6 is a simplified circuit diagram illustrating components of an exemplary differential voltage-mode driver according to an embodiment of the present invention.

FIG. 6 is a simplified circuit diagram illustrating components of an exemplary differential voltage-mode driver 600 according to an embodiment of the present invention. As shown in FIG. 6, the driver 600 may include a pair of circuit paths each extending between a pair of supply voltages ($V_{DD}$, $V_{SS}$) and including respective output terminals 604a, 604b. Each circuit path may include a switch 605a, 605b and a resistor 601a, 601b extending between the respective output terminal 604a, 604b and the first supply voltage $V_{DD}$, and a switch 606a, 606b and resistor 602a, 602b extending between the respective output terminal 604a, 604b and the second supply voltage $V_{SS}$. The driver 600 further may include a third resistor 603a, 603b coupled between each output terminal 604a, 604b and one of the supply voltages.

As shown in FIG. 6, the driver 600 may receive a pair of differential input signals D+ and D− and may output a pair of different output signals OUT+ and OUT− in response. An input signal (say, D+) may be input to the switches 605a, 606a of a first path. Similarly, the other input signal D− may be input to the switches 605b, 606b of a second path. Thus, when a differential input signal is asserted to the driver 600, one of the input signals D+, D− will cause its associated switches to conduct, which produce signal voltages on the output terminals 604a, 604b. Resistors 603a, 603b are always conductive in this embodiment. In the embodiment of FIG. 6 a balanced impedance at the outputs may be attained when resistors 601a and 601b are equal to resistors 602a and 602b. Consider an example where the D+ input is a high voltage level, which renders switches 605a and 606a conductive and, therefore, the D− input causes switches 605b and 606b to be non-conductive. In this example, if R601a, R601b, R602a, R602b, R603a, and R603b are all equal, the resistance from output terminal 604b to $V_{SS}$ is half the resistance of resistor 603a because resistors 602a and 603a are in parallel. The resistance from output terminal 604a to the voltage supplies also is half the resistance of resistor 603b because resistors 601a and 603b are effectively in parallel for output impedance purposes. Thus, the output impedances are balanced. In an exemplary embodiment where resistors 601a, 601b, 602a, 602b, 603a and 603b each are set to 300Ω and termination resistor 607 is set to 100Ω, the driver with a $V_{DD}$=1.2V will have a $V_{OD}$=150 mV and a $V_{CM}$=0.3V. Termination resistor 607 may be implemented separately from the driver as part of the receiver.

As previously noted, the resistance values present in the circuit may determine the differential voltage swing $V_{OD}$ and common mode voltage $V_{CM}$ that will arise in operation. In some implementations, the resistance values may remain static once the driver 600 is fabricated in an integrated circuit. In other embodiments the resistance values may vary dynamically during circuit operation. The variable resistor values may be set upon initialization of the driver according to calculated $V_{OD}$ and $V_{CM}$ requirements. In accordance with another embodiment, the variable resistor values may be selected from a multitude of predetermined values stored in local registers, where each value is selected to meet a specified $V_{CM}$.

Figure 7:
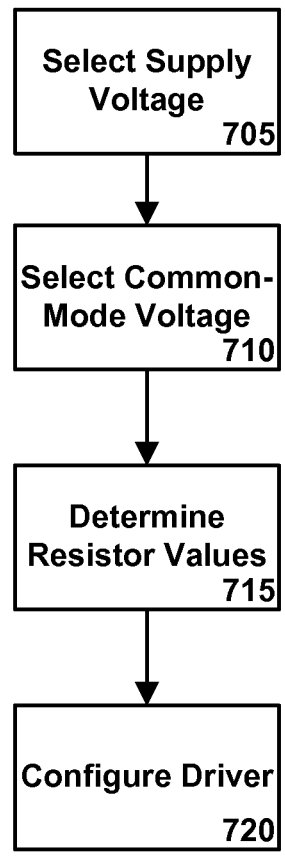
FIG. 7 is a simplified flow diagram illustrating a method of configuring a differential voltage-mode driver according to an embodiment of the present invention.

FIG. 7 is a simplified flow diagram illustrating a method 700 of configuring a differential voltage-mode driver according to an embodiment of the present invention. According to the method 700, to determine a configuration that may have a desired common-mode≠one half the supply voltage for a differential voltage driver, the desired supply voltage and common-mode voltage may first be selected (blocks 705-710). Then the resistor configuration and resistor values may be determined (block 715). For example, if a balanced output impedance should be maintained and if the common-mode voltage is greater than half the supply voltage, the resistors may be configured as in FIG. 5 and the resistor values set in accordance with Equation 1 and Equation 2. If, however, the common-mode voltage is less than half the supply voltage, the resistors may be configured as in FIG. 6. Other considerations may additionally influence the selected driver configuration. For example, if lower power is desired and the system is capable of tolerating a small amount of signal drift because the output signals don't completely settle, then some of the resistors may be set to infinite impedance, effectively removing a subset of the resistors from the driver. Alternatively, if power is available and a higher speed and lower output impedance is desired, additional switches and resistors may be activated in the driver. Then, once a configuration is selected, the differential voltage driver may be configured according to the determined resistor values (block 720).

Figure 8:
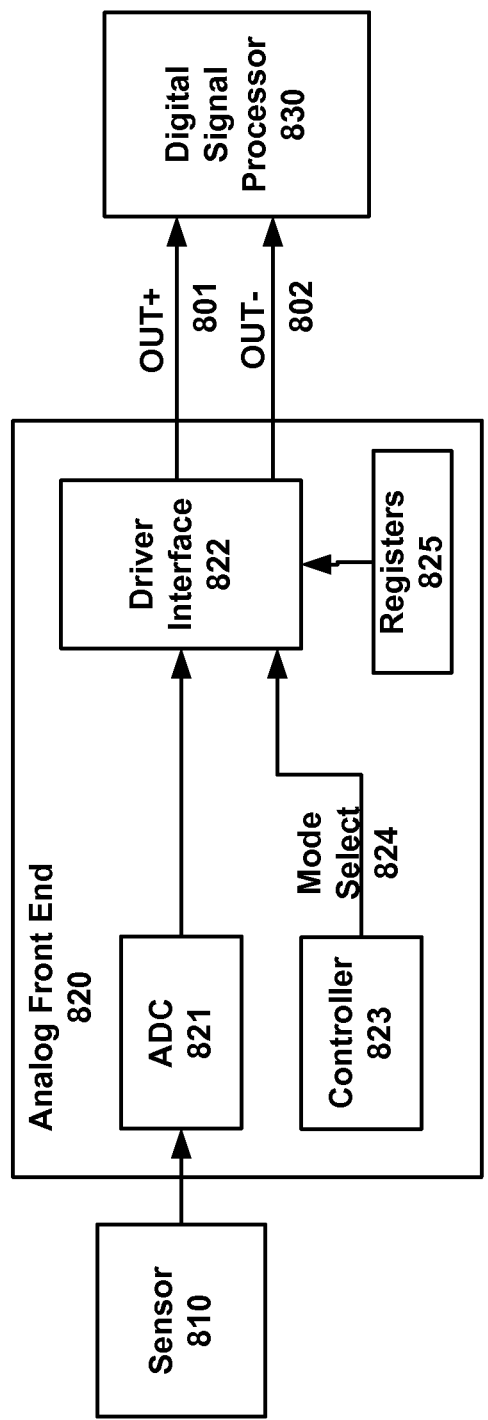
FIG. 8 is a simplified block diagram illustrating components of an exemplary system implementing a programmable differential voltage-mode driver according to an embodiment of the present invention.

FIG. 8 is a simplified block diagram illustrating components of an exemplary system 800 implementing a programmable differential voltage-mode driver according to an embodiment of the present invention. As shown in FIG. 8, an exemplary system 800 may include a sensor 810, an analog front-end circuit 820, and a digital signal processor (DSP) 830. The analog front-end 820 may include an analog-to-digital converter (ADC) 821, a programmable differential voltage-mode driver interface 822, a controller 823, and registers 825. The programmable differential voltage-mode driver interface 822 may be a differential signaling driver to transmit digitally converted signals to the DSP 830.

The programmable differential voltage-mode driver interface 822 may have multiple operational modes for he driver. The controller 823 may select one of the available operational modes and set the differential voltage-mode driver interface 822 configuration in accordance with the selected mode 824. Setting the differential voltage-mode driver interface 822 configuration may include activating or deactivating resistors or switches in the programmable differential voltage-mode driver interface 822 and setting the values of the activated resistors. The resistor values may be determined by the controller 823 or may be retrieved from the registers 825 for each mode. In an embodiment, the controller 823 may select from multiple potential resistor values stored in the registers 825 for each mode.

Figure 9:
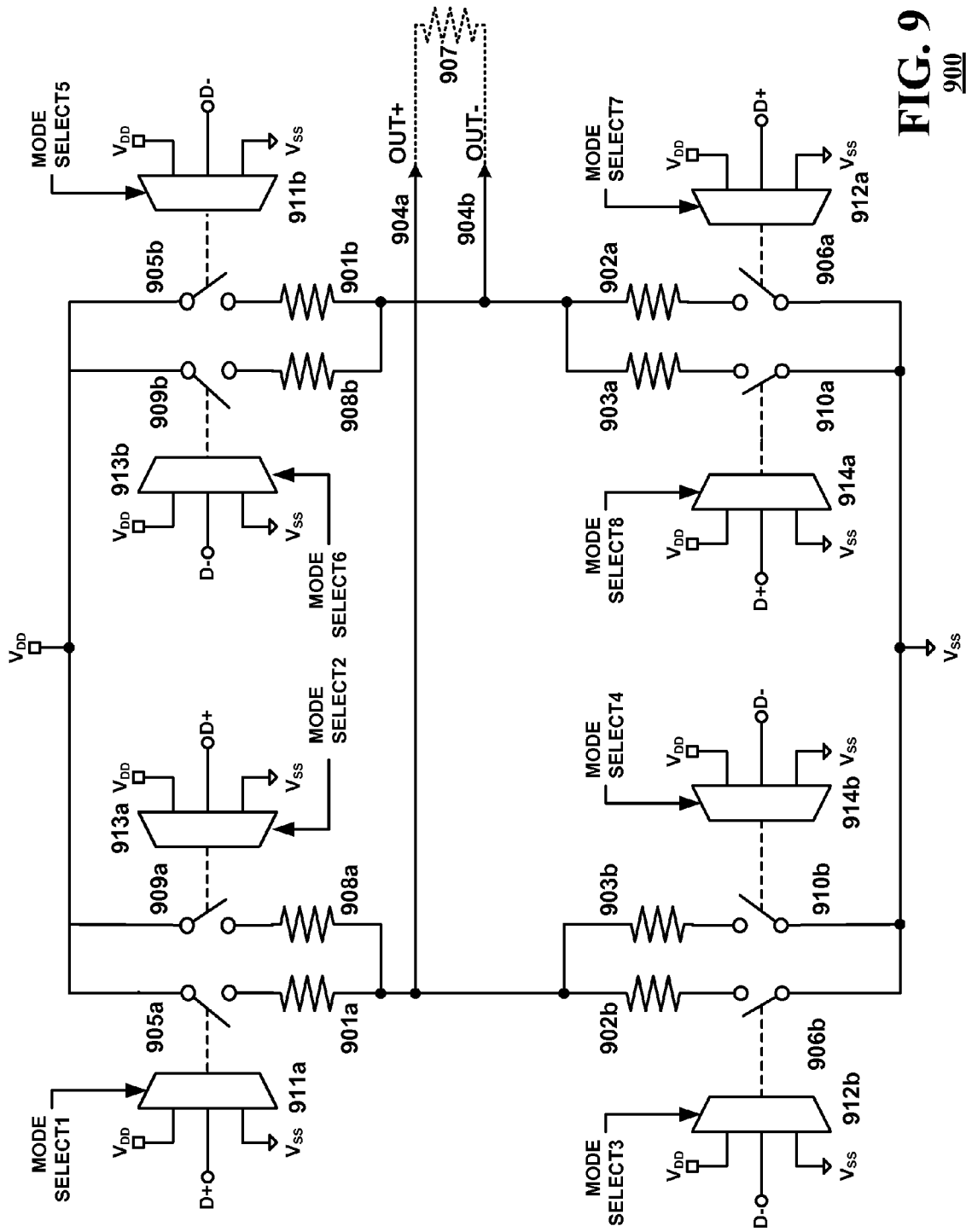
FIG. 9 is a simplified circuit diagram illustrating components of an exemplary differential voltage-mode driver according to an embodiment of the present invention.

For example, in an exemplary embodiment, the programmable differential voltage-mode driver interface 822 may have three potential modes. A first mode may be associated with a driver configured in accordance with the driver depicted in FIG. 10. A second mode may be associated with a driver configured in accordance with the driver depicted in FIG. 5. And a third mode may have additional resistors and switches activated to utilize a different power supply ($V_{DD}$), a higher differential swing ($V_{OD}$), or a lower output impedance to facilitate higher data speeds. FIG. 9 illustrates a possible method for implementing programmability, though it will be recognized by someone skilled in the art that the exact configuration is dependent on specific application requirements. The differential voltage driver interface outputs (OUT+ 801 and OUT− 802) produced in accordance with the selected mode may be transmitted on a pair of transmission lines to the DSP 830.

FIG. 9 is a simplified circuit diagram illustrating components of an exemplary differential voltage-mode driver 900 according to an embodiment of the present invention. As shown in FIG. 9, the driver 900 may include a pair of circuit paths each extending between a pair of supply voltages ($V_{DD}$, $V_{SS}$) and including respective output terminals 904a, 904b. Each circuit path may include switches 905a, 905b, 909a and 909b and resistors 901a, 901b, 908a, and 908b extending between the respective output terminal 904a, 904b and a first supply voltage $V_{DD}$ and switches 906a, 906b, 910a, and 910b and resistors 902a, 902b, 903a, and 903b extending between the respective output terminal 904a, 904b and the second supply voltage $V_{SS}$. The driver 900 may further contain a set of multiplexers (MUXes) 911a, 911b, 912a, 912b, 913a, 913b, 914a and 914b. Each MUX may have a selected mode input, the mode select determining whether the MUX output will be a D+, or D− as appropriate, or output $V_{DD}$ to set the connected switch as statically conductive or $V_{SS}$ to set the connected switch as statically non-conductive. Termination resistor 907 may be implemented separately from the driver, at the receiver for example.

As shown in FIG. 9, the driver 900 may receive a pair of differential input signals D+ and D− and may output a pair of differential output signals OUT+ and OUT− in response. Each input signal (say, D+) may be input to MUXes 911a, 912a, 913a, and 914a of a first circuit path. Then the mode select input may determine whether to pass that input signal to the connected switches 905a, 906a, 909a, and 910a or whether to set the switch as statically conductive or statically non-conductive. Similarly, the other input signal D− may be input to MUXes 911b, 912b, 913b, and 914b of a second circuit path with the mode select input to determine whether to pass that input signal to the connected switches 905b, 906b, 909b, and 910b. Then, for a given mode, any of the switches may be conductive, non-conductive, or receiving an input signal.

For example, if switches 909a and 909b are set by MUXes 913a and 913b with mode select 2 and mode select 6 respectively to be statically conductive, and switches 910a and 910b are set by MUXes 914a and 914b with mode select 4 and mode select 8 respectively to be statically non-conductive, the circuit will have the same characteristics as the driver shown in FIG. 5. Then, when a differential input signal is asserted to the driver 900, one of the input signals D+, D− will cause its associated switches to conduct, which produce signal voltages on the output terminals 904a, 904b. Resistors 908a, 908b are always conductive in this embodiment while resistors 903a and 903b are always non-conductive.

Figure 10:
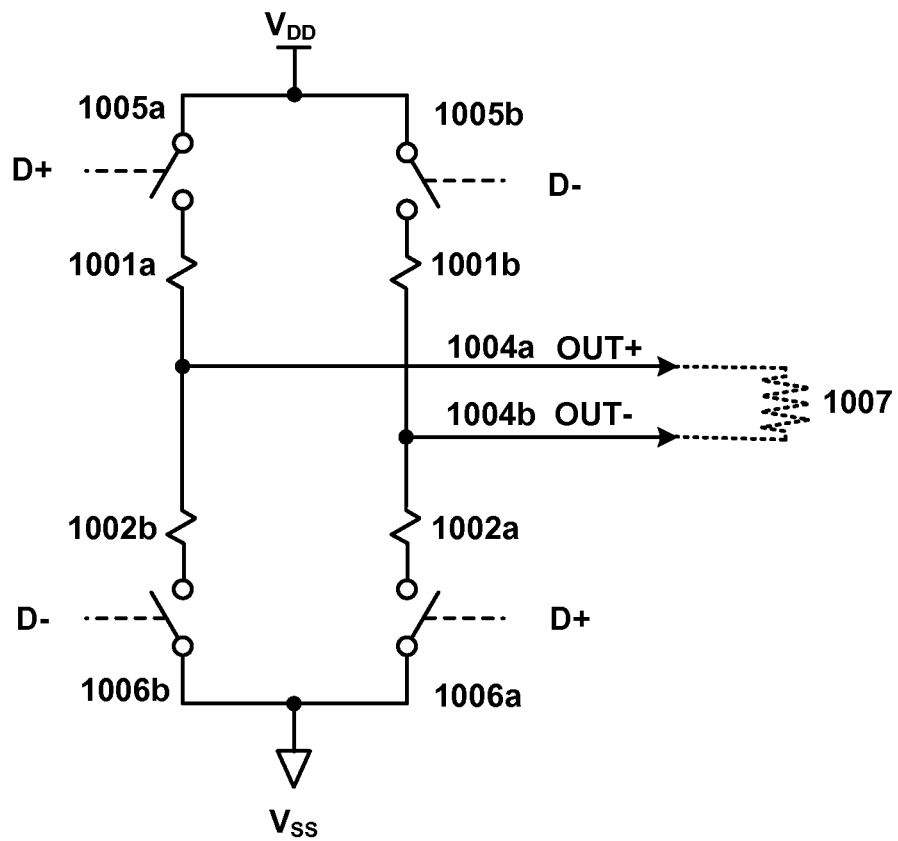
FIG. 10 is a simplified circuit diagram illustrating components of a differential voltage-mode driver.

In another mode, if switches 909a, 909b, 910a, and 910b are set by MUXes 913a, 913b, 914a, and 914b with mode select 2, mode select 6, mode select 4, and mode select 8 respectively to be statically non-conductive, the circuit will have the same characteristics as the driver shown in FIG. 10. Then, when a differential input signal is asserted to the driver 900, one of the input signals D+, D− will cause its associated switches to conduct, which produce signal voltages on the output terminals 904a, 904b. The resistors 903a, 903b, 908a, and 908b are always non-conductive in this embodiment.

According to an embodiment of the invention, the resistors in driver 900 may be dynamically adjusted according to environmental or other factors to achieve a fixed common-mode voltage and/or differential voltage swing. For example, if the power supply voltage changes unexpectedly, the resistor values may be adjusted to accommodate the change and maintain the desired common-mode voltage. A controller (not shown) may be implemented to detect a change in the power supply voltage, or to detect a change in the common-mode voltage and/or differential voltage swing, and adjust the elements of the driver 900 accordingly.

FIG. 10 is a simplified circuit diagram illustrating components of a differential voltage-mode driver 1000. As shown in FIG. 10, the driver 1000 may include a pair of circuit paths each extending between a pair of supply voltages ($V_{DD}$, $V_{SS}$) and including respective output terminals 1004a, 1004b. Each circuit path may include a switch 1005a, 1005b and a resistor 1001a, 1001b extending between the respective output terminal 1004a, 1004b and a first supply voltage $V_{DD}$ and a switch 1006a, 1006b and resistor 1002a, 1002b extending between the respective output terminal 1004a, 1004b and the second supply voltage $V_{SS}$.

As shown in FIG. 10, the driver 1000 may receive a pair of differential input signals D+ and D− and may output a pair of differential output signals OUT+ and OUT− in response. An input signal (say, D+) may be input to the switches 1005a, 1006a of a first path. Similarly, the other input signal D− may be input to the switches 1005b, 1006b of a second path. Thus, when a differential input signal is asserted to the driver 1000, one of the input signals D+, D− will cause its associated switches to conduct, which produce signal voltages on the output terminals 1004a, 1004b.

The driver's differential voltage swing $V_{OD}$ and common mode voltage $V_{CM}$ may depend on the values of the resistors within the circuit 1000. The resistors may therefore be set to achieve a specified common-mode voltage $V_{CM}$ and differential voltage swing $V_{OD}$. The differential voltage swing $V_{OD}$ and common mode-voltage $V_{CM}$ may be given as provided below in Equations 3 and 4:

$$V_{OD} = \frac{V_{DD} R_{1007}}{R_{1001} + R_{1002} + R_{1007}} \quad \text{Eq. 3}$$

$$V_{CM} = \frac{V_{DD}\left(R_{1002} + \frac{R_{1007}}{2}\right)}{R_{1001} + R_{1002} + R_{1007}} \quad \text{Eq. 4}$$

Consider an example, where the D+ input is a high voltage level, which renders switches 1005a and 1006a conductive and, therefore, the D− input causes switches 1005b and 1006b to be non-conductive. In an embodiment with resistors 1001 set to 150Ω and resistors 1002 set to 550Ω and termination resistor 1007 set to 100Ω, $V_{OD}$ is 150 mV and $V_{CM}$ is 0.9V with $V_{DD}$=1.2V.

However, the voltage-mode technique for achieving a 0.9V common-mode voltage with a power supply not equal to 1.8V illustrated in FIG. 10 may result in an unbalanced impedance at the output and may not be desirable in systems requiring efficient signal settling. Unbalanced impedance at the output may additionally impact the accurate transmission of the differential signal, for example by converting common-mode noise caused by EMI interference to a differential signal. Additionally, the voltage in the depicted driver may pump due to different time constants to $V_{DD}$ and $V_{SS}$ and thereby cause a common-mode signal drift. An unbalanced output may also generate EMI interference. Therefore, the driver illustrated in FIG. 10 may not be effective in systems with a low tolerance for error or signal drift. Accordingly, a programmable differential voltage driver, as in FIG. 8, may utilize a mode that configures the voltage-mode driver in accordance with the driver depicted in FIG. 10 in limited situations.

Although the invention has been described above with reference to LVDS and subLVDS differential signaling drivers, other differential signaling methods may be implemented with the voltage-mode techniques as described above. Additionally, although the above described circuits have been depicted using switches and separate resistors, in one or more embodiments, the switches may be implemented with a transistor and a resistor or a portion of a resistor may be implemented with a switch as a transistor.

The foregoing discussion identifies functional blocks that may be used in analog signal processing systems constructed according to various embodiments of the present invention. In some applications, the functional blocks described herein above may be provided as elements of an integrated software system, in which the blocks may be provided as separate elements of a computer program. In other applications, the functional blocks may be provided as discrete circuit components of a processing system, such as functional units within a digital signal processor or application-specific integrated circuit. Still other applications of the present invention may be embodied as a hybrid system of dedicated hardware and software components. Moreover, the functional blocks described herein need not be provided as separate units. For example, although FIG. 8 illustrates the components of the analog front-end 820 such as the controller 823 and the programmable differential signaling interface 822 as separate units, in one or more embodiments, some or all of them may be integrated and they need not be separate units. Such implementation details are immaterial to the operation of the present invention unless otherwise noted above.

While the invention has been described in detail above with reference to some embodiments, variations within the scope and spirit of the invention will be apparent to those of ordinary skill in the art. Thus, the invention should be considered as limited only by the scope of the appended claims.

We claim:

1. A differential signaling driver comprising:
    a first pair of switches, each provided in a circuit path from a respective output terminal to a first supply voltage,
    a first pair of resistors, one provided in each circuit path from the respective output terminal to the first supply voltage
    a second pair of switches, each provided in a circuit path from the respective output terminals to a second supply voltage,
    a second pair of resistors, one provided in each circuit path from the respective output terminal to the second supply voltage, and
    a third pair of resistors, one coupled to each output terminal and to a common one of the supply voltages;
    wherein output impedances at the output terminals are balanced.

2. The driver of claim 1, wherein each of the third pair of resistors is coupled to the first supply voltage.

3. The driver of claim 1, wherein each of the third pair of resistors is coupled to the second supply voltage.

4. The driver of claim 1, wherein each of the third pair of resistors is coupled to a third supply voltage.

5. The driver of claim 1, further comprising a third pair of switches, each provided in a circuit path that includes one of the third pair of resistors.

6. The driver of claim 1, wherein
    a first signal controls a switch of a circuit path from a first output terminal to the first supply voltage and a switch of a circuit path from a second output terminal to the second supply voltage,
    a second signal controls a switch of a circuit path from the second output terminal to the first supply voltage and a switch of a circuit path from the first output terminal to the second supply voltage, and
    only one of the first signal or the second signal is asserted at a time.

7. The driver of claim 1, wherein the first and second pairs of resistors have common resistance values.

8. The driver of claim 1, wherein all resistors have common resistance values.

9. The driver of claim 1, wherein:
    the first supply voltage is 1.2 volts,
    the second supply voltage is ground, and
    voltages on the output terminals have a common-mode voltage ($V_{CM}$) of 0.9 volts.

10. The driver of claim 1 wherein the second supply voltage is set to ground potential.

11. The driver of claim 10 wherein the common-mode voltage is greater than one-half the first supply voltage.

12. The driver of claim 10 wherein the common-mode voltage is less than one-half the first supply voltage.

13. The driver of claim 1 wherein at least a subset of circuit paths are active to produce a low signal and a different subset of circuit paths are active to produce a high signal.

14. The driver of claim 1 wherein the switches are implemented as transistors.

15. The driver of claim 1 wherein the resistors of each circuit path and the switch of each circuit path are implemented as a transistor.

16. The circuit of claim 1 wherein a portion of the resistors of each circuit path and the switch of each circuit path are implemented as a transistor.

17. A transmission system, comprising:
a differential signaling driver having a pair of outputs for a differential output signal, the driver circuit having balanced impedances at the outputs, the differential output signal having a common-mode voltage that deviates from one-half the supply voltage;
a transmission line having a pair of conductors coupled to output terminals of the driver circuit; and
a receiver circuit having a termination resistor coupled across the conductors.

18. The transmission system of claim 17, wherein the differential signaling driver circuit comprises:
a first pair of switches, each provided in a circuit path from a respective output terminal to a first supply voltage;
a first pair of resistors, one provided in each circuit path from a respective one of the output terminals to the first supply voltage;
a second pair of switches, each provided in a circuit path from a respective one of the output terminals to a second supply voltage;
a second pair of resistors, one provided in each circuit path from a respective one of the output terminals to the second supply voltage;
and a third pair of resistors, one coupled to each output terminal and to a common one of the supply voltages.

19. The transmission system of claim 17 wherein a first supply voltage operates at 1.2 volts and the differential output signal has a common-mode voltage of 0.9 volts.

* * * * *